United States Patent [19]

Llewellyn

[11] Patent Number: 5,374,860
[45] Date of Patent: Dec. 20, 1994

[54] MULTI-TAP DIGITAL DELAY LINE
[75] Inventor: William D. Llewellyn, San Jose, Calif.
[73] Assignee: National Semiconductor Corporation, Santa Clara, Calif.
[21] Appl. No.: 4,042
[22] Filed: Jan. 15, 1993
[51] Int. Cl.⁵ ............................................. H03K 5/153
[52] U.S. Cl. ..................................... 327/276; 327/261; 327/72
[58] Field of Search ............... 307/358, 595, 601, 602, 307/603, 605, 608

[56] References Cited

U.S. PATENT DOCUMENTS

| | | | |
|---|---|---|---|
| 3,668,532 | 6/1972 | Potash | 307/602 |
| 5,049,766 | 9/1991 | van Driest et al. | 307/603 |
| 5,063,311 | 11/1991 | Swapp | 307/603 |
| 5,097,489 | 3/1992 | Tucci | 375/120 |

OTHER PUBLICATIONS

W. D. Llewellyn et al., "A 33 Mb/s Data Synchronizing Phase-Locked Loop Circuit," Feb. 1988, IEEE ISSCC Digest of Technical Papers, vol. 31, pp. 12–13.
National Semiconductor Mass Storage Handbook, 1989, pp. 2-38 and 2-39.
B. Kim, "High Speed Clock Recovery in VLSI Using Hybrid Analog/Digital Techniques," Memorandum No. UCB/ERL M90/50, Jun. 6, 1990, Elec. Research Lab., UC Cal., Berkeley, CA, p. 81.

*Primary Examiner*—William L. Sikes
*Assistant Examiner*—James Dudek
*Attorney, Agent, or Firm*—Townsend and Townsend Khourie and Crew

[57] ABSTRACT

A programmable digital delay line having N delay elements, two multiplexers connected to the output of the delay elements, and a comparator connected to the outputs of the multiplexers is disclosed. The invention teaches an apparatus and a method of delaying a signal, while reducing the number of delay elements and the number of connections to multiplexers. In a first embodiment of the invention, the delay elements are inverters or differential delay elements. In a second embodiment, the delay elements are differential delay elements.

59 Claims, 10 Drawing Sheets

MULTI-TAP DIGITAL DELAY LINE

BACKGROUND OF THE INVENTION

The present invention relates generally to digital delay lines, and more specifically to an integrated digital delay line scheme with programmable delay capability.

Digital delay lines have a variety of applications, e.g., in pulse-shapers, in clock de-skewing circuits, as well as in serial data re-synchronization circuits. The application of interest here is serial data re-synchronization and clock recovery in hard disk drive read channel circuitry. In this application, the delay line is used as an "anticipator" delay in a clock recovery phase-locked loop (PLL). This allows the PLL to "look-ahead" within the incoming data stream and anticipate the presence or absence of data pulses, enabling the loop to remain locked to quasi-random data patterns without interpreting "missing" data pulses as drops in input frequency. The delay line can also serve the function of aligning the data re-synchronization (bit capture) window in this type of application.

Figure 1:
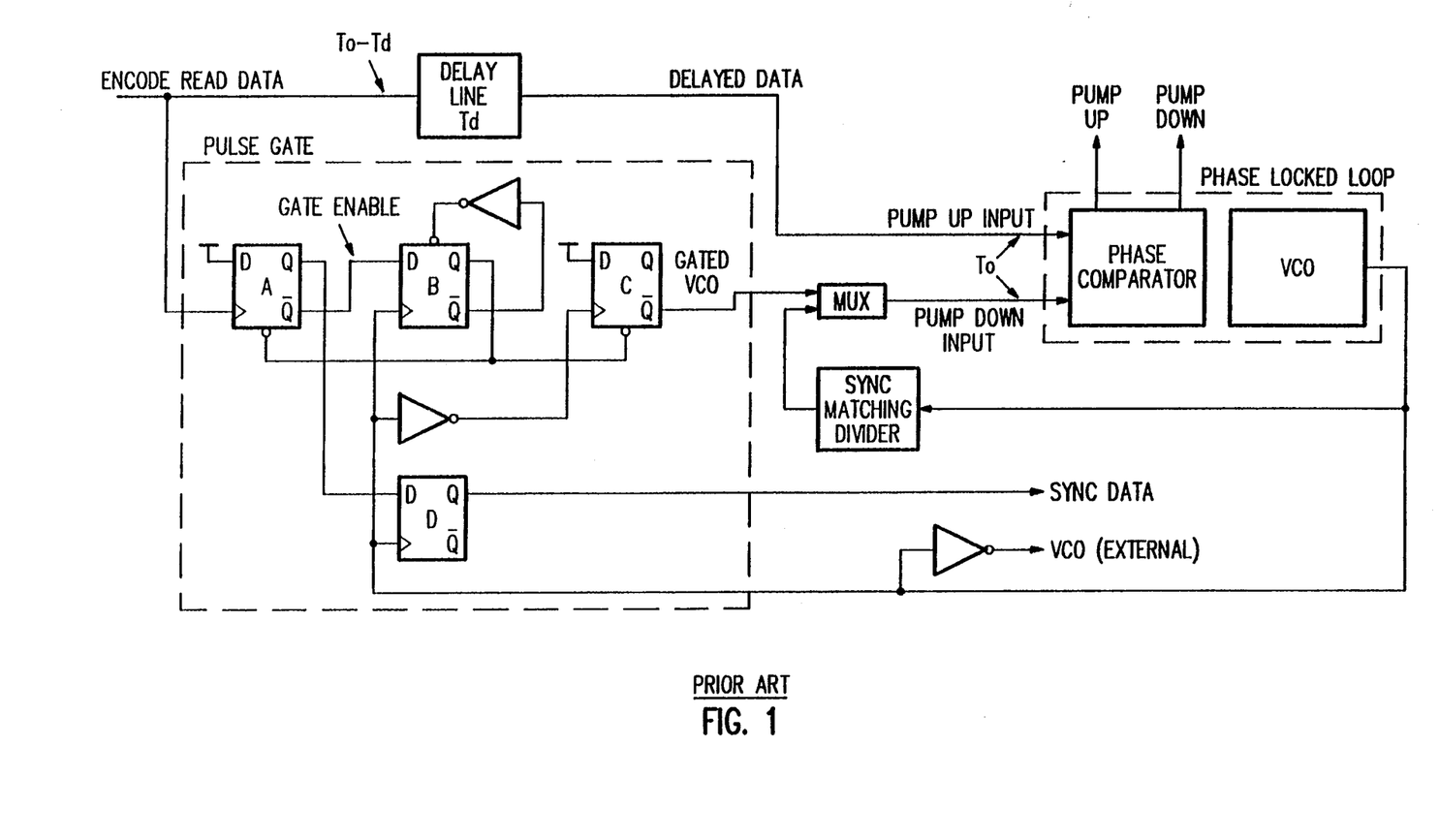
FIGS. 1 and 2 are circuit schematics of digital delay lines according to the prior art.

FIG. 1 shows a conventional scheme employed for this purpose as shown in National Semiconductor Mass Storage Handbook, 1989, pp. 2-38 and 2-39, incorporated herein by reference. Variation of the delay line magnitude, $T_d$, produces a proportional shift in the position (centering) of the data window. This is useful for de-skewing purposes or channel margin testing.

Figure 2:
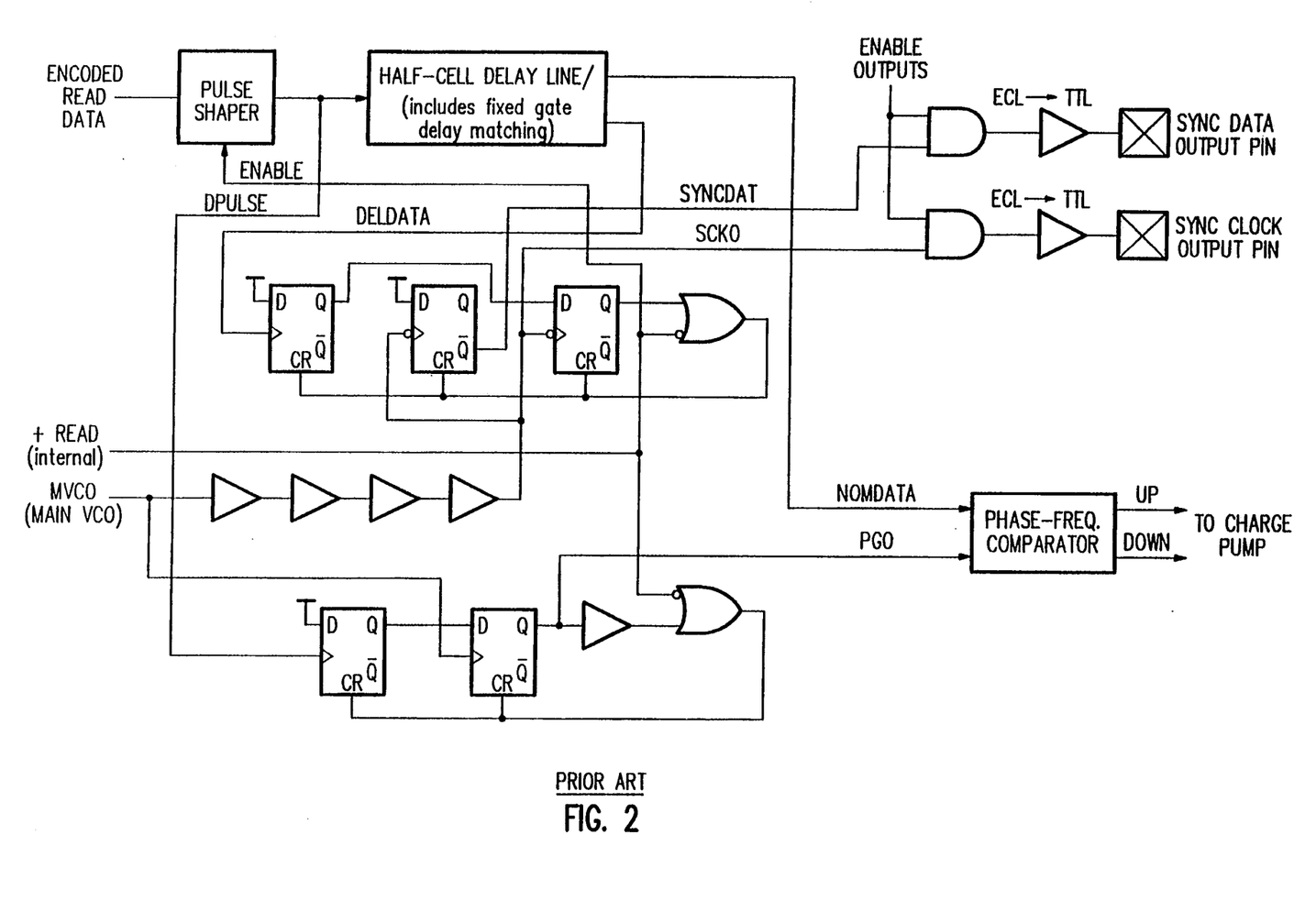

FIG. 2 shows an alternate scheme where the delay line has two outputs: a nominal output used for PLL phase comparisons, and a second, variable output used by the bit capture circuitry (data latch) for data re-synchronization as described in U.S. Pat. No. 5,097,489 to Tucci, assigned to the assignee of the present invention and incorporated herein by reference. Variation of the delay at the variable output moves the data re-synchronization window without disturbing the phase equilibrium of the PLL.

The circuit techniques used to achieve controlled delay vary significantly. The delay line of FIG. 1 employs a starved ring oscillator and a 5-bit programmable counter. The ring oscillator operates over a 3:1 frequency range while the counter extends the effective delay line operation to 100:1 as described in "A 33 Mb/s Data Synchronizing Phase-Locked Loop Circuit," ISSCC Digest of Technical Papers, vol. 31, February 1988, pp. 12–13; incorporated herein by reference. The half-cell delay line of FIG. 2 is comprised of a multiplicity of differential delay stages and an M-wide multiplexer. The M-inputs of the multiplexer are connected to M sequential tap points within the delay line; the output of the multiplexer is the variable delay output whose timing is simply a function of the selected delay line tap. It should be noted that, to generate a delayed signal, only the two outputs of any particular delay stage are used.

Jitter is also an important consideration in delay line construction, since it is undesirable to add any random or uncontrolled time modulation to the digital pulses being passed through the delay line. This would be particularly true if starved delay stage elements were being used and the delay line were to be closed on itself for use as a ring oscillator. In this case the jitter of each stage would accumulate as the pulse circulated around within the ring, exacerbating the jitter problem.

Figure 3:
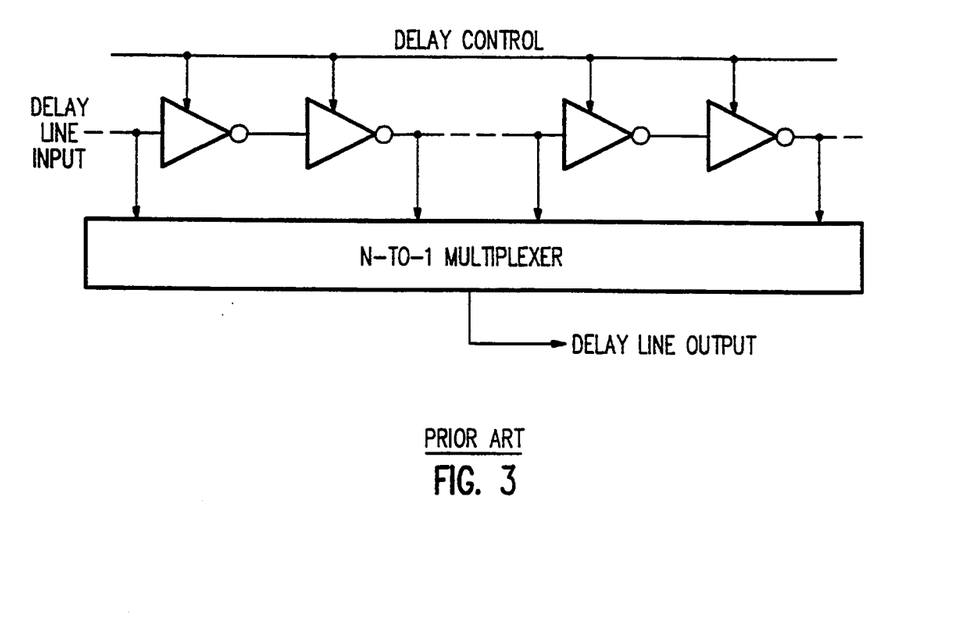
FIG. 3 is a circuit schematic of an inverter-based multiplexed delay line with non-inverting taps according to the prior art.

Of the three types of conventional digital gates which can be used as starved delay elements, the type which exhibits the least per-stage jitter is a simple, fast-skewing inverter, such as that described in "High Speed Clock Recovery in VLSI Using Hybrid Analog/Digital Techniques," by Beomsup Kim, Memorandum No. UCB-/ERL M90/50, 6 Jun. 1990, Elec. Research Lab., UC Cal., Berkeley, Calif., page 81, incorporated herein by reference. Unfortunately, a unipolar pulse traversing an inverter-based delay line produces edges of opposite sense (polarity) at each node. In order to prevent odd tap number inversion, some schemes use every other inverter output for each tap point (FIG. 3). However, this reduces the resolution of the delay taps by doubling the time displacement between them and increases the number of delay elements needed. Other schemes use differential delay elements where either signal sense is available, although differential delay elements tend to be slower than simple inverters, again sacrificing resolution.

For these reasons, a digital delay line is desired with a lower number of delay elements in comparison with the prior art, with a lower number of tap connections with the multiplexers in the system and which offers a low jitter system alternative.

SUMMARY OF THE INVENTION

The present invention is directed to an apparatus for delaying an input signal comprising at least one delay element which has at least one input for receiving the input signal and one output. The signal at the output is a delayed representation of the input signal. A comparator is coupled to the input and the output of the delay element for comparing the input signal and the delayed signal to produce an output signal. The comparator output signal is the input signal delayed by a set period.

The present invention is further directed to an apparatus with a plurality of delay elements connected in series. The delay elements are connected to a first and a second multiplexer. The outputs of the two multiplexers are connected to a comparator, enabling the system to generate a delayed input signal, having the same sense (polarity) as the input signal. The multiplexers provide the capability of setting a desired delay by programming means.

In one embodiment of the present invention, the delay element is an inverter. In this configuration, the input signal is delayed by the time delay caused by the inverter.

In a second embodiment, the delay element is a differential delay device. The input signal is delayed while passing through each delay element.

The present invention, therefore, provides a digital delay line which reduces the number of delay elements needed by half that needed in prior art systems. The present invention further provides a digital delay line which reduces the number of tap connections with the multiplexers in comparison with the prior art. The digital delay apparatus of the present invention further increases the resolution of the delay line without increasing the number of delay elements required. In addition, the present invention provides a system with substantially lower jitter problems than known digital delay circuits.

DESCRIPTION OF THE PREFERRED EMBODIMENTS

The circuit realizing the present invention is represented here in CMOS technology, however, the principle may be applied to other technologies as well.

Figure 4A:
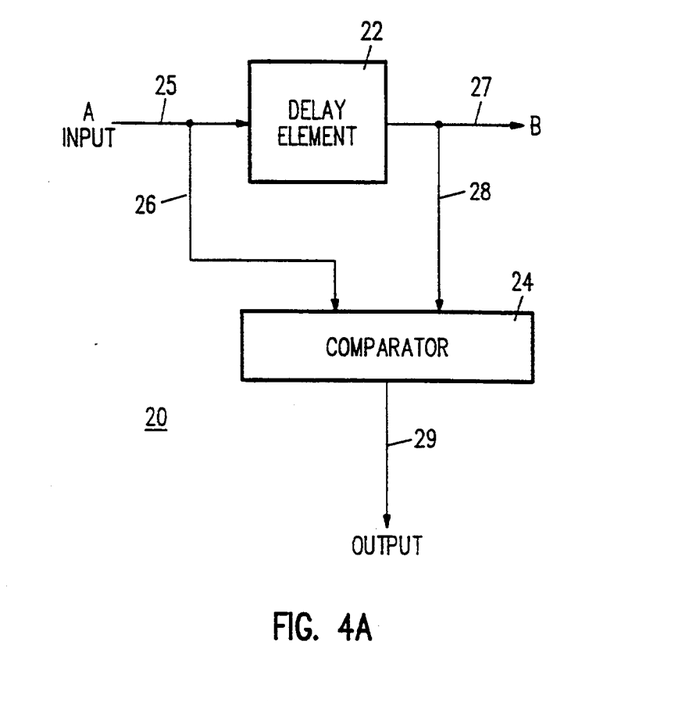
FIG. 4A is a simplified block diagram of a digital delay line according to the principles of the present invention.

FIG. 4A represents a block diagram of a preferred embodiment of a digital delay line according to the present invention. The delay line 20 consists of a delay element 22 and a comparator 24. Delay element 22 has an input 25 and an output 27, and is connected to the inputs of comparator 24 via signal lines 26 and 28. Signal line 29 represents the output of the delay line. The input signal is applied to the delay line at input 25. In an exemplary embodiment, the delay element 22 may be an inverter producing an output of opposite sense (polarity) with respect to its input. The comparator is therefore used to produce a delayed signal with the same sense (polarity) of the input signal. When the comparator compares the input signal and the output signal, it generates an output signal, at signal line 29, which is a representation of the input signal, at signal line 25, delayed by the period of delay caused by the delay element.

Figure 4B:
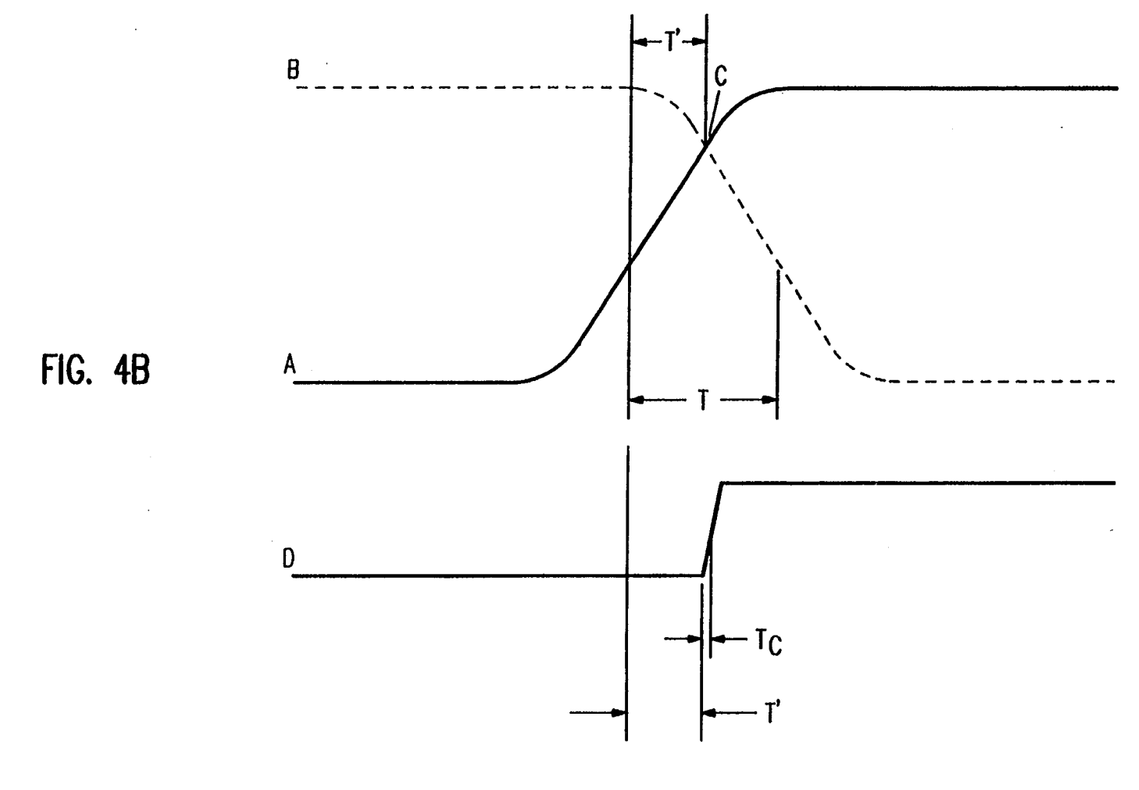
FIG. 4B is a diagram showing the input and output signals of the delay line in FIG. 4A as a function of time.

FIG. 4B shows the input signal (A) and the output signal (B) of the delay element 22 in FIG. 4A. Please note that, although the delay line is a digital delay line, the input and output signal transitions occur over a finite period of time, i.e., the transition looks more like an analog signal with finite rise and fall periods. Furthermore, it is presumed that these rise and fall periods (also known as slew rates) are equal, although they need not be equal in the present invention. Generally, if one examines the signal at the output of the delay element, it is delayed by T seconds, where T is the time delay generated by the delay element. It is normally measured from the point in time that the input signal reaches 50 percent of its final value to the point in time that the output signal reaches 50 percent of its final value.

On the other hand, if one examines signal 29, at the output of the comparator 24, it is delayed by $T'+T_c$ seconds, where $T'$ is a fraction of time T and $T_c$ is a time delay generated by the comparator. Generally, $T'$ is equal to ½ of T if the delay element output rise and fall period are equal, and is measured from the point that the input signal reaches 50 percent of its final value to the point that the input signal (A) crosses the output signal (B). The reduction in the delay time is caused by the operation of the comparator. A comparator changes state from a low to a high state, or from a high to a low state, as soon as its differential input signals cross each other. This crossing point is shown in FIG. 4B and is denoted by "C". The crossing point can be set at the fabrication stage or by changing the biasing power to the delay element. The waveform "D" represents the signal at the output of the comparator in FIG. 4B. It shows the delay caused by the comparator in addition to the delay caused by the delay line.

Figure 5:
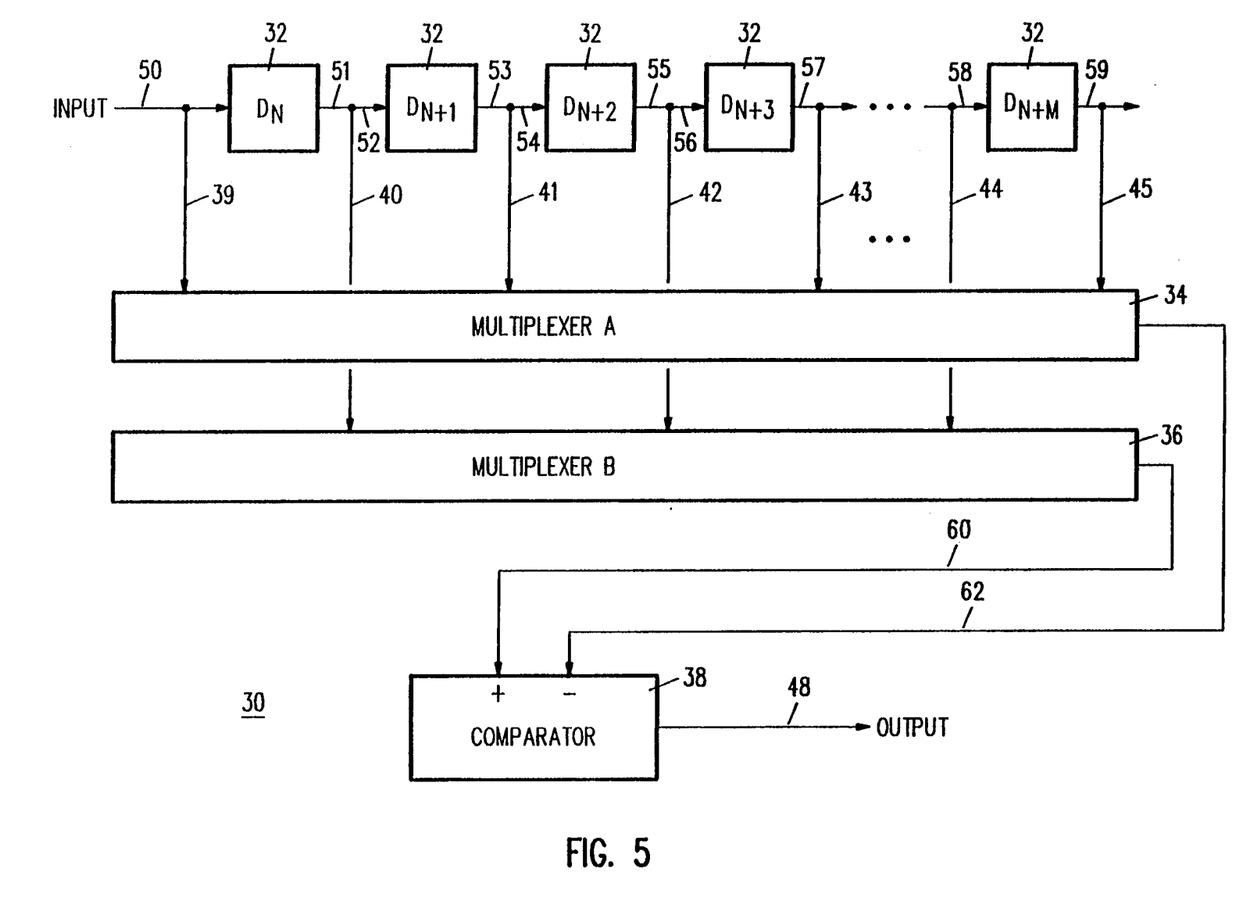
FIG. 5 is a block diagram of a digital delay line according to the principles of the present invention including the multiplexers.

FIG. 5 is a block diagram of a further preferred embodiment of a delay line 30 according to the present invention using more than one delay element. Block diagram 30 contains delay element 32 denoted by $D_N$ through $D_{N+M}$, a pair of M-wide multiplexers 34 and 36, and a comparator 38. The comparator 38 has a positive and a negative input and an output. Each of the delay elements have at least one input (inputs 50, 52, 54, 56, 58, . . . ) and at least one output (outputs 51, 53, 55, 57, 59, . . . ). The delay elements 32 are connected in series and are also connected to the multiplexers 34 and 36 via taps 39-45. The multiplexers 34 and 36 are connected to the input of the comparator 38 via outputs 60 and 62. The output of comparator 48 is the output of the delay line 30. The multiplexers 34 and 36 provide the programming capability to select the desired total time delay. The multiplexers have select lines (not shown) that can be set using conventional digital means such as, a DAC, a computer, or dip switches, to select a particular input. The time delay will be the aggregate of time delays caused by the individual delay elements selected via multiplexers 34 and 36 and any delay caused by the comparator.

It is desirable to obtain a pulse or edge output from the delay line, multiplexed from any point along the chain, while maintaining the sense (polarity) of the pulse or edge, i.e., avoiding any possible inversion between each stage. To achieve this, the inputs of the A-multiplexer 34 are connected to the inputs of every odd delay element 32 via taps 39, 41, 43, 45, etc. The inputs of the B-multiplexer 36 are connected to the inputs of every even delay element 32 via taps 40, 42, 44, etc. For purposes of discussion, the sense (polarity) of the edge entering stage N is assumed to be positive-going (this would be fixed by system design). The operation of the comparator in the present invention will be described below in connection with FIGS. 6-8.

Figure 6:
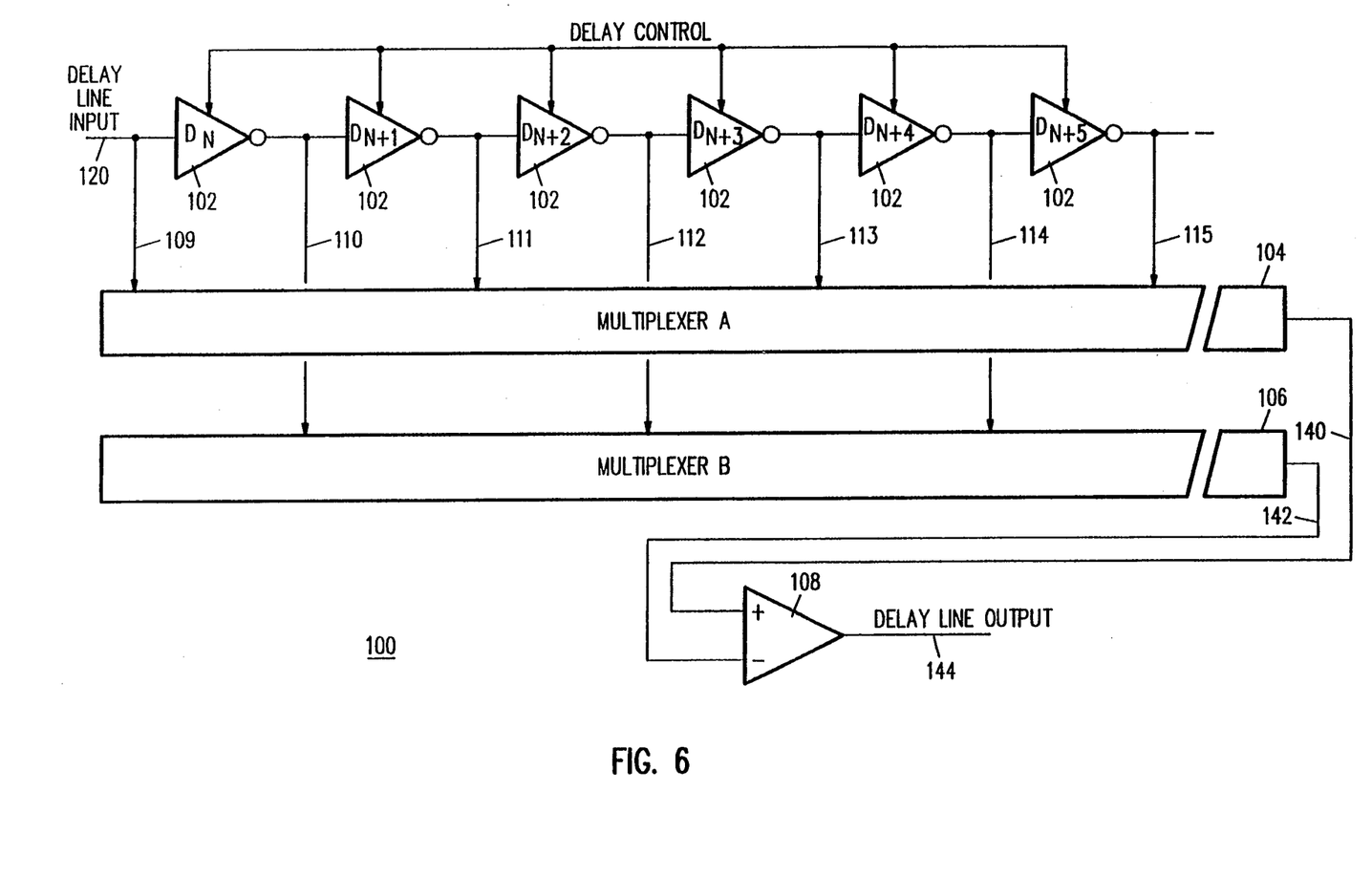
FIG. 6 is a circuit schematic of a first embodiment of the digital delay line of the present invention, using inverters.

In the embodiment of FIG. 6, the delay line has a series of N starved CMOS inverter stages 102 denoted by $D_N$ through $D_{N+5}$, two M-wide multiplexers 104 and 106 with $M \leq N$, and a voltage comparator 108. The comparator 108 has a positive and a negative input and an output. The inverter stages 102 are connected in series as shown in FIG. 6. The inverters 102 are also connected to A-multiplexer 104 and B-multiplexer 106 using taps 109-115. The output of the multiplexers are connected to the inputs of comparator 108 via signal lines 140 and 142. The comparator output 144 is the output of delay line 100. It should be noted that each inverter 102 causes T seconds of delay, for example, $D_N$ causes $T_N$ seconds of delay, $D_{N+1}$ causes $T_{N+1}$ seconds of delay, etc. It should also be noted that, although $T_N$ and $T_{N+1}$ could be equal, sometimes it is desired to design a delay line with select gates, within the delay chain, having a different delay period than the other gates.

The choice of the CMOS-type inverter was made for compactness, simplicity and low jitter, and follows a general migration of hard disk read channel and communications circuits onto CMOS technology for its conventional advantages over bipolar or bipolar-CMOS technologies. The inverters are biased to produce some desired total delay through the delay line; this can be done using a DAC, or by slaving the delay line bias signal to a delay-locked loop, or by slaving the delay line to a PLL whose ring oscillator is constructed from gates identical to those in the delay line. The invention is by no means limited to the use of the above methods to generate a total delay and a variety of other known techniques to achieve a desired total delay through the delay line may be employed.

Comparator 108 enables the system to obtain a pulse or edge output from the delay line, multiplexed from any point along the chain, while maintaining the sense (polarity) of the pulse or edge, i.e. avoiding the inherent inversion between each stage. To achieve this, the inputs of the odd inverters are connected to the inputs of the A-multiplexer 104 via taps 109, 111, 113, 115, etc., and the inputs of the even inverters are connected to the inputs of B-multiplexer 106 via taps 110, 112, 114, etc. Again, the sense (polarity) of the edge entering stage N is assumed to be positive-going (this would be fixed by system design). To select stage N for transmission to the output, the input of the A-multiplexer connected to tap 109 and the input of the B-multiplexer connected to tap 110 are enabled. It should be understood that by enabling either multiplexers 104 and 106, the signal on the selected input port is transferred to the output port.

Enabling the multiplexers places a positive-going edge at the comparator positive input and a negative edge at the comparator negative input as the leading edge of the delayed pulse passes through stage N. The comparator output changes state as its inputs cross each other. The resulting output is a replica of the input signal delayed by a set period. It should be noted that by connecting the output of the A-multiplexer 104 to the negative input of the comparator and the output of the B-multiplexer 106 to the positive input of the comparator, the output of the comparator will be an inverted representation of the input signal delayed by a set period. This is also true for the embodiments of FIG. 7 and FIG. 8, these embodiments will be explained later.

To select stage N+1, the input of the A-multiplexer connected to tap 111 and the input of the B-multiplexer connected to tap 110 are enabled. The sense of the edge traversing the delay line is negative as it enters stage N+1, having been inverted by stage N. This places a negative-going edge at the negative input and a positive-going edge at the positive input of the comparator 108 as the leading edge of the delayed pulse passes through stage N+1. Again, the comparator output changes state as its inputs cross each other, with resulting output being an edge with the desired positive sense. With this embodiment, for example, one can achieve a time delay equal to a selected period of $(\frac{1}{2} \times T_N) + (T_c)$, $(T_N) + (\frac{1}{2} \times T_{N+1}) + (T_c)$, $T_N + T_{N+1} + (\frac{1}{2} \times T_{N+2}) + (T_c)$, where $T_N$, $T_{N+1}$ and $T_{N+2}$ represent the time delay caused by each respective delay element and $T_c$ represents the delay caused by the comparator.

In general, to transmit any given stage N to the delay line output, the corresponding multiplexer inputs connected to the input and output of that stage are enabled. Since the multiplexer inputs are set to alternate (reverse) between inverting stages, the inversions are "cancelled-out" when seen by the comparator inputs. This allows every stage within the delay line to be available for multiplexing with no inversion of polarity at the delay line output. The invention thus allows for a significant reduction in the number of delay elements (reducing it by half of the delay elements used in prior art). This is significant for IC design in achieving circuit compactness.

Furthermore, the present invention reduces the power consumption of the delay line by a factor of 4 in comparison to the prior art, still maintaining the same tap-to-tap delay resolution as prior art. For example, a prior art delay line, as shown in FIG. 3, needs at least 20 invertors to provide a 10 tap delay line. If each invertor draws (I/2)nA of current, the total current drawn by the delay line will be (10I)nA. The total power consumption of the delay line is equal to the square of the current multiplied by the resistance of the individual invertor $R_i$. Hence, the power consumption of the delay line of the prior art is equal to:

$$P_{Prior\,Art} = (10)^{2} * (I)^{2} * (R_i)$$

In contrast, the power consumption in the delay line of the present invention is equal to:

$$P = (10)^{2} * (I/2)^{2} * (R_i)$$

$$P = 25 I^2 R_i$$

Clearly, the power consumption of the delay line according to the present invention is reduced by a factor of 4, assuming the invertor resistances are equal.

Figure 7:
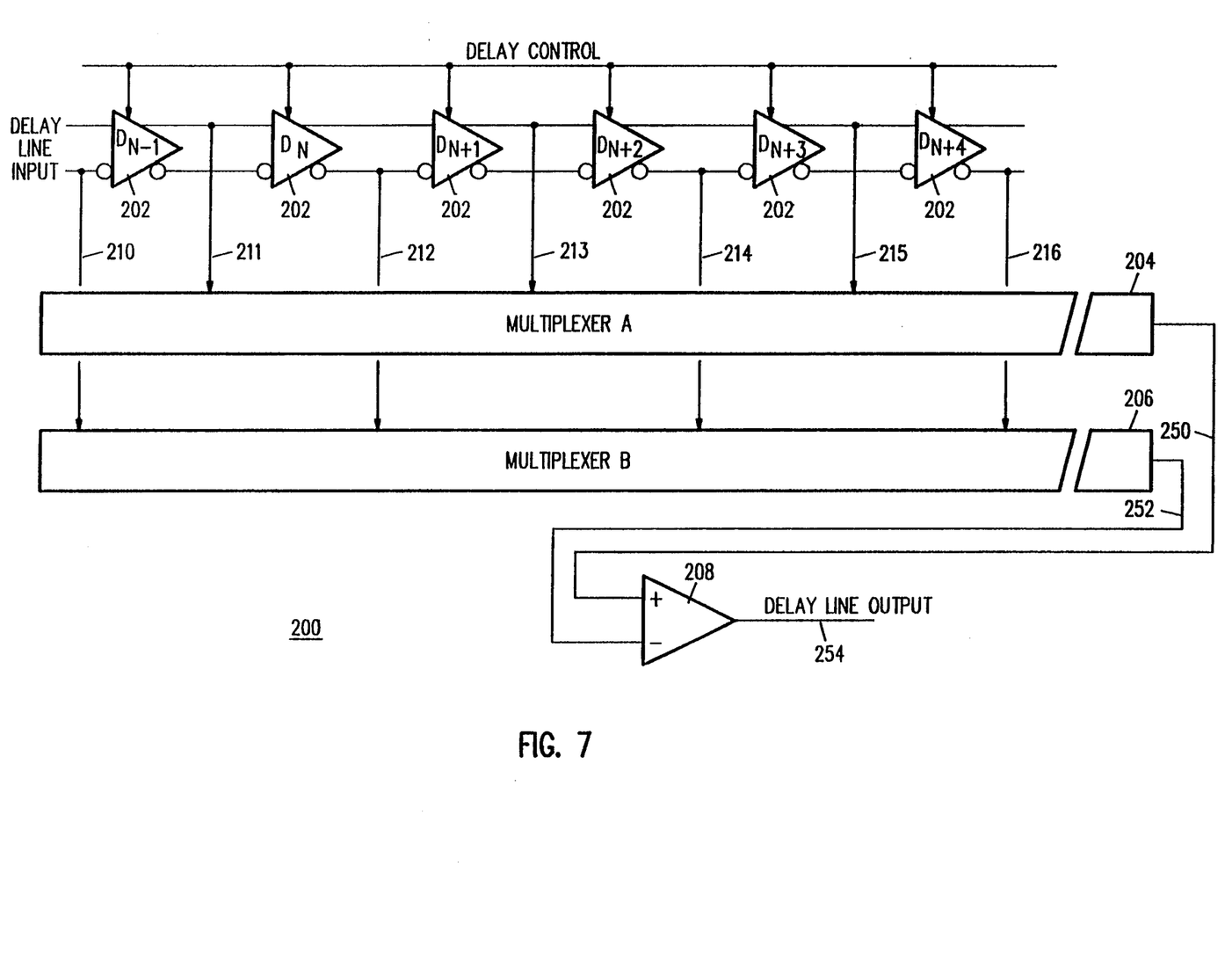
FIG. 7 is a circuit schematic of the first embodiment of the present invention, using differential delay elements.

FIG. 7 illustrates a first embodiment of the present invention using differential delay stages rather than inverters. The delay line 200 has a series of differential delay stages 202, two M-wide multiplexers 204 and 206, and a voltage comparator 208. The comparator 208 has a positive and a negative input and an output. The differential delay stages 202 are connected in series as shown in FIG. 7. The differential delay stages 202 are also connected to A-multiplexer 204 and B-multiplexer 206 using taps 210–216. The output of the multiplexers are connected to the inputs of the comparator 208 via signal lines 250 and 252. The output of the comparator 208, signal line 254, is the output of the delay line 200.

The operation of the circuit in FIG. 7 is, in other respects, identical to that in FIG. 6. For example, to select stage N for transmission to the output, the input of the A-multiplexer connected to tap 211 and the input of the B-multiplexer connected to tap 212 are enabled. Enabling the multiplexers places a positive-going edge at the comparator positive input and a negative edge at the comparator negative input as the leading edge of the delayed pulse passes through stage N. The comparator output changes state as its inputs cross each other. The resulting output is a replica of the input signal delayed by a set period.

The invention thus allows for a significant reduction in the number of multiplexer taps (half) and fewer interconnect leads with respect to the fully differential tap technique of the prior art. This also is significant for IC design in achieving circuit compactness.

Figure 8:
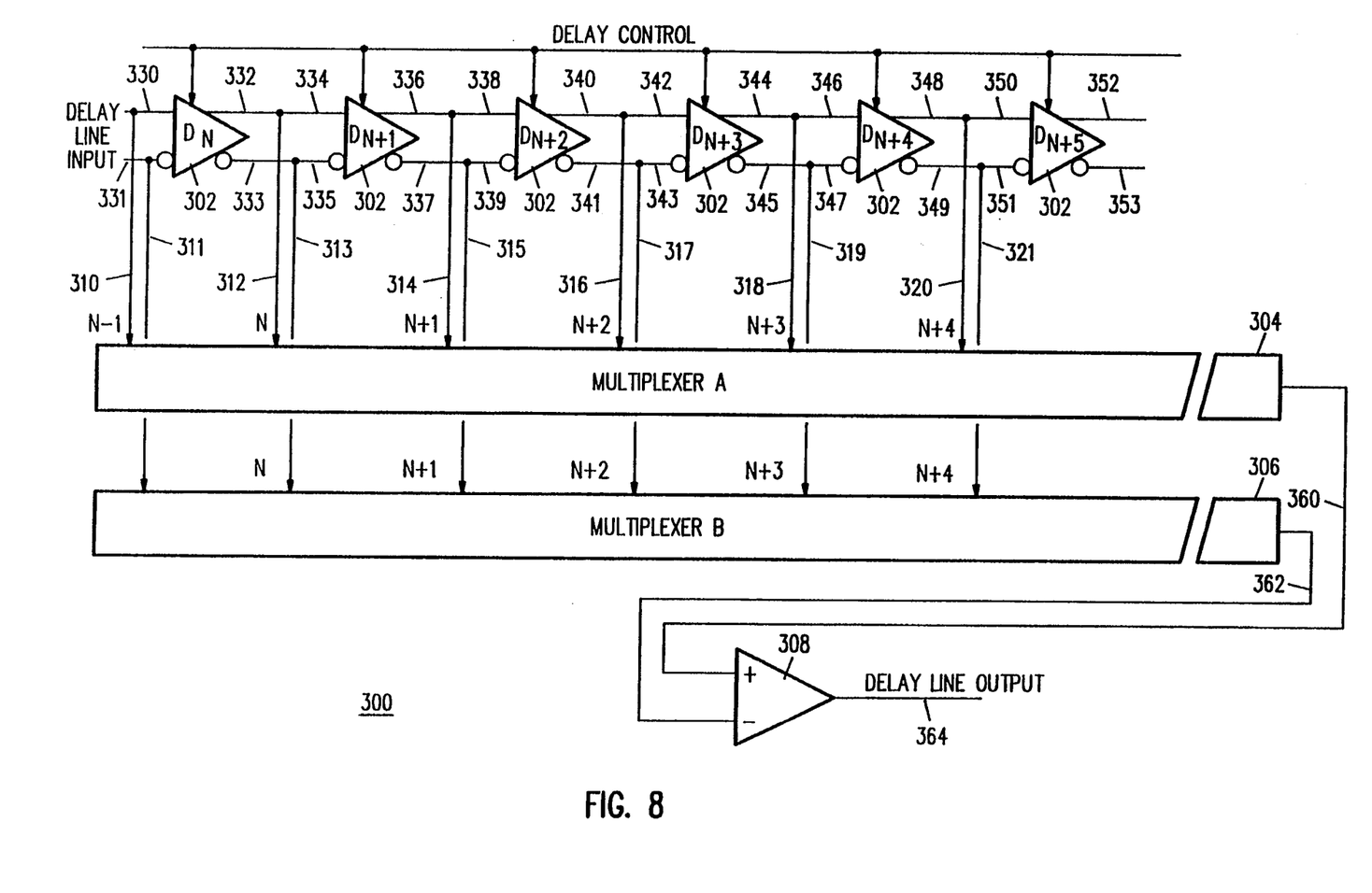
FIG. 8 is a circuit schematic of a second embodiment of the digital delay line of the present invention, using differential delay elements.

FIG. 8 illustrates a second embodiment of the digital delay system of the present invention. The differential delay elements 302, denoted by $D_N$ through $D_{N+5}$, in FIG. 8 are connected in series as shown. Each delay element has a pair of complementary inputs (inputs (330, 331), (334, 335), (338, 339), etc.) and a pair of complementary outputs (outputs (332, 333), (336, 377), (340, 341), etc.). The positive inputs of the delay elements 302 are connected to the inputs of A-multiplexer 304 (i.e. taps 310, 312, 314, 316, 318, 320, etc.) and the negative inputs of the delay element are connected to inputs of B-multiplexer 306 (i.e. taps 311, 313, 315, 317, 319, 321, etc.). The output of the multiplexers are connected to the inputs of the comparator 308 via signal lines 360 and 362. The comparator 308 has a positive input connected to signal line 360 and a negative input connected to signal line 362 and an output connected to signal line 364.

This embodiment allows for "splitting" of the magnitude of the difference of the delay between delay taps within a differential delay chain, that is, inserting a pseudo-tap between all existing taps by using a multiplexing approach. The magnitude of the delay between adjacent differential taps, e.g., between N and N+1, is simply equal to the delay of a single differential delay stage. Conventional multiplexing requires that the multiplexer inputs for both multiplexer A and B relating to a given differential delay element be selected simultaneously at any one time, e.g., delay element N will have both A and B-multiplexer inputs (i.e. 312 and 313) enabled simultaneously. However, it is possible to split the difference between the delay at the outputs of delay stages N and N+1 to achieve an equivalent "N+½" tap. This can be done by enabling the A-multiplexer tap for the output of delay stage N (tap 312) and the B-multiplexer tap for the output of the delay stage N+1 (tap 315), or by enabling the B-multiplexer tap for the output of the delay stage N (tap 313) and the A-multiplexer tap for the output of the delay stage N+1 (tap 314). This applies to all other adjacent tap positions, as well. This splitting of delay line taps essentially doubles the resolution of the delay line while requiring a relatively minor increase in multiplexer tap selection logic complexity, yet requiring no additional delay line or multiplexer circuitry.

For example, using this technique, one can achieve a total delay equal to:

a) $(½ \times T_N) + T_c$ by selecting taps 310 and 313 or 312 and 311;

b) $(T_N) + T_c$ by selecting taps 312 and 313;

c) $(T_N) + (½ \times T_{N+1}) + T_c$ by selecting taps 312 and 315 or 314 and 313;

d) $(T_N) + (T_{N+1}) + T_c$ by selecting taps 314 and 315;

e) $(T_N) + (T_{N+1}) + (½ \times T_{N+2}) + T_c$ by selecting taps 318 and 317 or 316 and 319;

where $T_N$, $T_{N+1}$, and $T_{N+2}$ represent the delay generated by $D_N$, $D_{N+1}$, and $D_{N+2}$ delay elements, respectively, and $T_c$ is the delay generated by the comparator.

Figure 9:
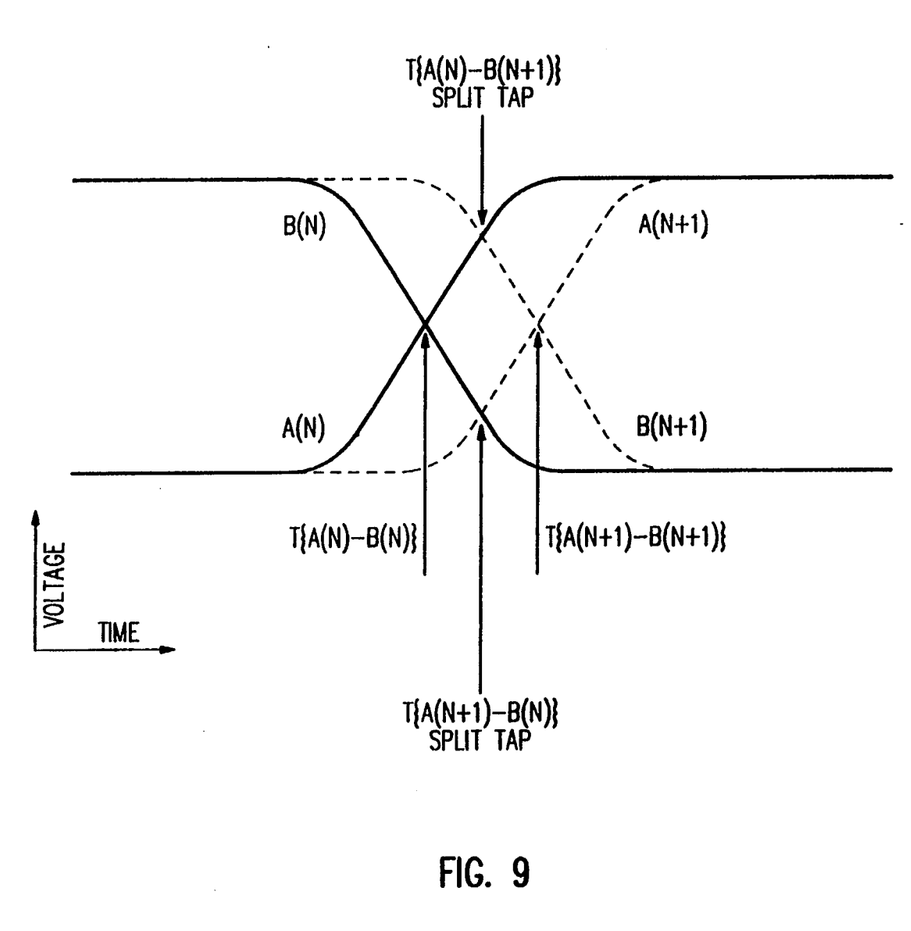
FIG. 9 is a diagram of voltage as a function of time of a tap-splitting waveform produced by the delay line of FIG. 8.

FIG. 9 shows waveforms at the input and output of any delay stage N; non-inverting and inverting inputs to the multiplexers, respectively, are referred to as A(N) and B(N), corresponding to the multiplexers A and B, and the non-inverting and inverting outputs are referred to as A(N+1) and B(N+1). The delay between conventional taps would be the difference between waveform crossing points T[A(N+1)−B(N+1)] and T[A(N)−B(N)]. It can be seen from the waveforms that the crossing points at split taps T[A(N)−B(N+1)] and T[A(N+1)−B(N)] occur simultaneously and are halfway in between conventional taps T[A(N+1)−B(N+1)] and T[A(N)−B(N)[. Therefore, either of these split taps can be used as a pseudo-tap in between the two conventional taps.

Thus, these pseudo-taps can be used to allow a delay line with M stages to have 2M equally-spaced taps, while requiring half the circuitry and associated power consumption of a 2M stage delay line.

Figure 10A:
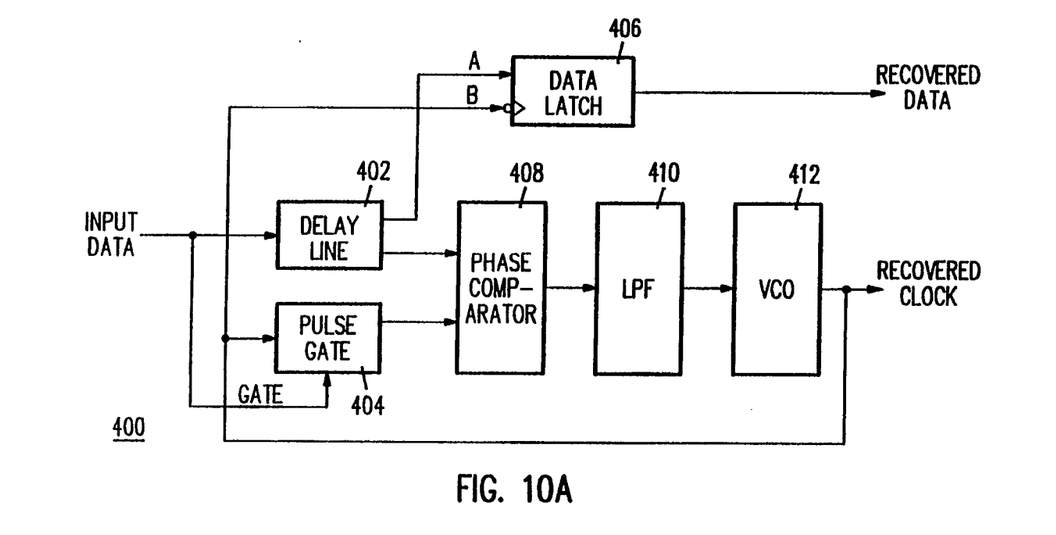
FIG. 10A is a circuit schematic of an exemplary application of the delay line of the present invention in a data/clock recovery PLL.

FIG. 10A shows one application of the present invention in a data/clock recovery PLL. The circuit of FIG. 10A contains a delay line 402, a pulse gate 404, a phase comparator 408, a Low Pass Filter (LPF) 410, a voltage controlled oscillator (VCO) 412, and a data latch 406. The circuit uses the delay line 402 in a phase locked loop to retime the clock and to recover the data from the input data.

Figure 10B:
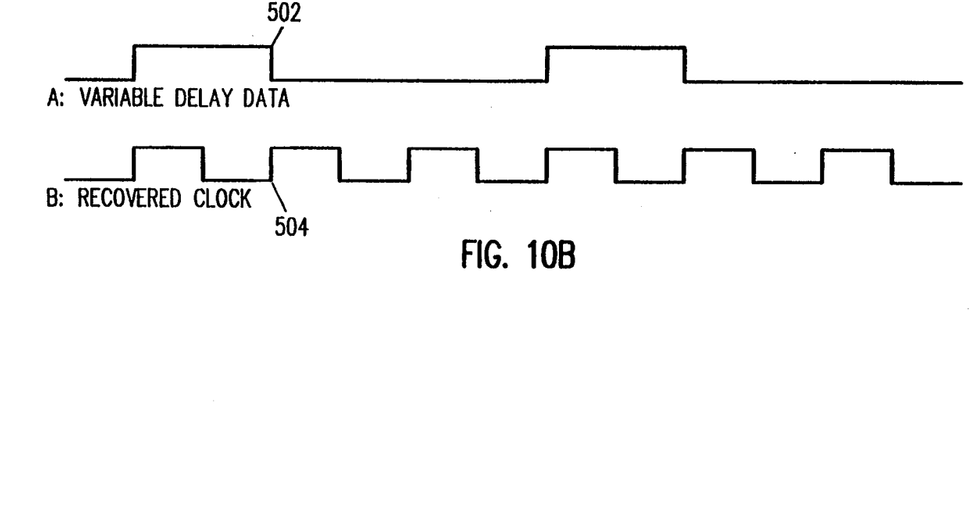
FIG. 10B is a diagram of the variable delay line and recovered clock signals of the PLL of FIG. 10A.

FIG. 10B illustrates the variable delay data signal 502 and the recovered signal clock 504. These two signals are used to recover the data using data latch 406.

The digital delay line of the present invention has now been explained with reference to specific embodiments. Other embodiments will be apparent to those of ordinary skill in the art. It is therefore not intended that this invention be limited except as indicated by the appended claims.

What is claimed is:

1. An apparatus for delaying an input signal comprising:

a first delay element for producing a first delayed signal, said first delayed element having at least a first input for receiving a first input signal and at least a first output, said first delayed signal being a first representation of said first input signal delayed by a first period;

a second delay element for producing a second delayed signal, said second delay element having at least a second input for receiving said first delayed signal and at least a second output, said second delayed signal being a second representation of said first delayed signal delayed by a second period, and said second input of said second delay element being coupled to said first output of said first delay element; and a comparator for comparing said first and second delayed signal to produce an output signal, said comparator having a third and a fourth input and an output, said third input being coupled to said first output and said fourth input being coupled to said second output, said output signal being said input signal delayed by a third period plus any delay caused by said comparator.

2. An apparatus as set forth in claim 1 wherein said first and second representations are inversion.

3. An apparatus as set forth in claim 1 wherein said third input is a positive input and said fourth input is a negative input.

4. An apparatus as set forth in claim 1 wherein said third input is a negative input and said fourth input is a positive input.

5. Apparatus of claim 1 further comprising:

a first multiplexer coupled between said first input and said third input for programmably selecting said first input signal; and a second multiplexer coupled between said second input and said fourth input for programmably selecting said first delayed signal.

6. An apparatus as set forth in claim 5 wherein said second output is coupled to said first multiplexer for programmably selecting said second delayed signal.

7. An apparatus as set forth in claim 1 wherein said third period is equal to a fraction of said first period.

8. An apparatus as set forth in claim 7 wherein said fraction is equal to one half.

9. An apparatus as set forth in claim 1 wherein said third period being equal to said first period plus a fraction of said second period.

10. An apparatus as set forth in claim 9 wherein said fraction is equal to one half.

11. An apparatus as set forth in claim 1 wherein said first and said second delay elements are inverters.

12. An apparatus as set forth in claim 1 wherein said first delay element has a fifth input for receiving a second input signal and a third output for producing a third delay signal, said third delay signal being a second representation of said second input signal delayed by said first period; and said second delay element has a sixth input for receiving said third delayed signal and a fourth output for producing a fourth delayed signal, said third output is coupled to said sixth input and said fourth delayed signal is a non-inverted version of said third delayed signal delayed by said second period.

13. An apparatus as set forth in claim 12 wherein said second input signal is an inverted version of said first input signal.

14. An apparatus as set forth in claim 12 wherein said third delayed signal is an inverted version of said first delayed signal.

15. An apparatus as set forth in claim 12 wherein said fourth delayed signal is an inverted version of said second delayed signal.

16. Apparatus of claim 12 further comprising:
a first multiplexer coupled between said first input and said third input for programmably selecting said first input signal; and
a second multiplexer coupled between said sixth input and said fourth input for programmably selecting said third delayed signal.

17. An apparatus as set forth in claim 16 wherein said second output is coupled to said first multiplexer for programmably selecting said second delayed signal.

18. An apparatus as set forth in claim 16 wherein said third period is equal to a fraction of said first period.

19. An apparatus as set forth in claim 18 wherein said fraction is equal to one half.

20. An apparatus as set forth in claim 17 wherein said third period is equal to said first period plus a fraction of said second period.

21. An apparatus as set forth in claim 20 wherein said fraction is equal to one half.

22. Apparatus of claim 12 further comprising:
a first multiplexer coupled between said first and second inputs and said third input for programmably selecting said first input signal and said first delayed signal; and
a second multiplexer coupled between said fifth and sixth inputs and said fourth input for programmably selecting said second input signal and said third delayed signal.

23. An apparatus as set forth in claim 22 wherein said second output is coupled to said first multiplexer and said fourth output is coupled to said second multiplexer for programmably selecting said second and fourth delayed signal.

24. An apparatus as set forth in claim 23 wherein if said first and said sixth inputs are programmably selected, said third period is equal to a fraction of said first period.

25. An apparatus as set forth in claim 24 wherein said fraction is equal to one half.

26. An apparatus as set forth in claim 23 wherein if said fifth and said second inputs are programmably selected, said third period is equal to a fraction of said first period.

27. An apparatus as set forth in claim 26 wherein said fraction is equal to one half.

28. An apparatus as set forth in claim 23 wherein if said second and sixth inputs are programmably selected, said third period is equal to said first period.

29. An apparatus as set forth in claim 23 wherein if said second input and said fourth output are programmably selected, said third period is equal to said first period plus a fraction of said second period.

30. An apparatus as set forth in claim 29 wherein said fraction is equal to one half.

31. An apparatus as set forth in claim 23 wherein if said sixth input and said second output are programmably selected, said third period is equal to said first period plus a fraction of said second period.

32. An apparatus as set forth in claim 31 wherein said fraction is equal to one half.

33. An apparatus as set forth in claim 23 wherein if said second and said fourth outputs are programmably selected, said third period is equal to said first period plus said second period.

34. An apparatus as set forth in claim 1 wherein said first and said second delay elements are differential delays.

35. A method of delaying an input signal comprising the steps of:
delaying said input signal to produce a first delayed signal, said first delayed signal being a representation of said input signal delayed by a first period;
delaying said first delayed signal to produce a second delayed signal, said second delayed signal being said representation of said first delayed signal delayed by a second period;
comparing said input signal and said first delayed signal to produce a first output signal, said first output signal being said input signal delayed by a third period plus any delay caused by said comparing of said input signal and said first delayed signal.

36. The method of claim 35 further comprising the step of:
comparing said first delayed signal and said second delayed signal to produce a second output signal, said second output signal being delayed by a fourth period plus any delay caused by said comparing of said first delayed signal and said second delayed signal.

37. The method of claim 35 further comprising the steps of:
inputting said input signal to a first multiplexing element for programmably selecting said input signal; and
inputting said first delayed signal to a second multiplexing element for programmably selecting said first delayed signal.

38. The method of claim 37 further comprising the step of:

inputting said second delayed signal to said first multiplexing element for programmably selecting said second delayed signal.

39. The method of claim 35 wherein said representation is an inversion.

40. The method of claim 35 wherein said third period is equal to a fraction of said first period.

41. The method of claim 40 wherein said fraction is equal to one half.

42. The method of claim 36 wherein said fourth period is equal to said first period plus a fraction of said second period.

43. The method of claim 42 wherein said fraction is equal to one half.

44. A method of delaying an input signal comprising the steps of:

inputting a first input signal to a first input of a first delay element;

inputting a second input signal to a second input of said first delay element;

delaying said first input signal in said first delay element to produce a first delayed signal, said first delayed signal being said first input signal delayed by a first period;

delaying said second input signal in said first delay element to produce a second delayed signal, said second delayed signal being said second input signal delayed by said first period;

comparing one of said first and second input signals with one of said first and second delayed signals to produce a first output signal, said first output signal being said first input signal delayed by a second period plus any delay caused by said comparing of said one of said first and second input signals with one of said first and second delayed signals.

45. The method of claim 44 wherein said first input signal is compared with said second delayed signal to produce said first output signal.

46. The method of claim 44 wherein said first delayed signal is compared with said second input signal to produce said first output signal.

47. The method of claim 44 wherein said second input is an inverted version of said first input, and said second delayed signal is an inverted version of said first delayed signal.

48. The method of claim 44 wherein said second period is a fraction of said first period.

49. The method of claim 48 wherein said fraction is equal to one half.

50. The method of claim 44 further comprising the step of:

comparing said first delayed signal and said second delayed signal to produce a third output signal, said third output signal being said first input signal delayed by said first period plus any delay caused by said comparing of said delayed signal and said second delayed signal.

51. The method of claim 44 further comprising the steps of:

inputting said first delayed signal to a first input of a second delay element;

inputting said second delayed signal to a second input of said second delay element;

delaying said first delayed signal in said second delay element to produce a third delayed signal, said third delayed signal being said first delayed signal delayed by a third period;

delaying said second delayed signal in said second delay element to produce a fourth delayed signal, said fourth delayed signal being said second delayed signal delayed by said third period; and comparing one of said first and second delayed signals with one of said third and fourth delayed signals to produce a fourth output signal, said fourth output signal being said first input signal delayed by a fourth period plus any delay caused by said comparing of said one of said first and second delayed signals with one of said third and fourth delayed signals.

52. The method of claim 51 wherein said first delayed signal is compared with said fourth delayed signal to produce said fourth output signal.

53. The method of claim 51 wherein said third delayed signal is compared with said second delayed signal to produce said fourth output signal.

54. The method of claim 51 wherein said fourth period is equal to said first period plus a fraction of said third period.

55. The method claim 54 wherein said fraction is equal to one half.

56. The method of claim 51 further comprising the step of:

comparing said third delayed signal and said fourth delayed signal to produce a fifth output signal, said fifth output signal being said first input signal delayed by said first period plus said third period plus any delay caused by said comparing of said third delayed signal and said fourth delayed signal.

57. The method claim 51 further comprising the steps of:

inputting said first input signal, said first delayed signal, and said third delayed signal to a first multiplexer for programmably selecting among said first input signal, said first delayed signal, and said third delayed signal; and inputting said second input signal, said second delayed signal, and said fourth delayed signal to a second multiplexer for programmably selecting among said second input signal, said second delayed signal, and said fourth delayed signal, said first multiplexer and said second multiplexer being coupled to a comparator.

58. The method of claim 44 wherein said first delay element is a differential delay.

59. The method of claim 51 wherein said second delay element is a differential delay.

* * * * *